United States Patent
Yamashita et al.

(10) Patent No.: US 9,478,465 B2
(45) Date of Patent: Oct. 25, 2016

(54) WAFER PROCESSING METHOD

(71) Applicant: DISCO CORPORATION, Tokyo (JP)

(72) Inventors: Yohei Yamashita, Tokyo (JP); Kenji Furuta, Tokyo (JP); Yihui Lee, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/878,641

(22) Filed: Oct. 8, 2015

(65) Prior Publication Data

US 2016/0104643 A1 Apr. 14, 2016

(30) Foreign Application Priority Data

Oct. 9, 2014 (JP) .................. 2014-207802

(51) Int. Cl.
*H01L 21/78* (2006.01)
*H01L 21/02* (2006.01)

(52) U.S. Cl.
CPC ......... *H01L 21/78* (2013.01); *H01L 21/02005* (2013.01)

(58) Field of Classification Search
CPC .......................... H01L 21/78; H01L 21/02005
See application file for complete search history.

(56) References Cited

U.S. PATENT DOCUMENTS

| | | | | |
|---|---|---|---|---|
| 2004/0002199 A1* | 1/2004 | Fukuyo | .............. | B23K 26/0057 438/460 |
| 2009/0121337 A1* | 5/2009 | Abe | .................. | B23K 26/0057 257/686 |
| 2010/0267219 A1* | 10/2010 | Kajiyama | .......... | B23K 26/0057 438/462 |
| 2012/0088354 A1* | 4/2012 | Furuta | .................... | H01L 21/78 438/463 |
| 2013/0302969 A1* | 11/2013 | Priewasser | ............ | H01L 21/784 438/458 |

FOREIGN PATENT DOCUMENTS

| | | |
|---|---|---|
| JP | 2002-192370 | 7/2002 |
| JP | 2006-054246 | 2/2006 |
| JP | 2012-084618 | 4/2012 |

* cited by examiner

*Primary Examiner* — Minh-Loan Tran
*Assistant Examiner* — Farid Khan
(74) *Attorney, Agent, or Firm* — Greer Burns & Crain, Ltd.

(57) ABSTRACT

A method of processing a wafer having a device area where a plurality of devices are formed and a peripheral marginal area surrounding the device area on the front side of the wafer is disclosed. The devices are formed in regions defined by division lines. Each device has a plurality of bump electrodes on the front side. A first laser beam is applied through dicing tape from the back side along the boundary between the device area and the peripheral marginal area, with the focal point of the first laser beam set inside the wafer, thereby forming an annular modified layer inside the wafer. A second laser beam is applied through the dicing tape from the back side along each division line with the focal point of the second laser beam set inside the wafer, thereby forming a modified layer inside the wafer along each division line.

1 Claim, 6 Drawing Sheets

WAFER PROCESSING METHOD

BACKGROUND OF THE INVENTION

1. Field of the Invention

The present invention relates to a wafer processing method of processing a wafer having a front side on which a plurality of crossing division lines are formed to define a plurality of separate regions where a plurality of devices are respectively formed.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are respectively formed. The semiconductor wafer is cut along the division lines to thereby divide the regions where the devices are formed from each other, thus obtaining individual semiconductor chips.

As a method of dividing a wafer such as a semiconductor wafer along the division lines, there has been tried a laser processing method using a pulsed laser beam having a transmission wavelength to the wafer, wherein the pulsed laser beam is applied to the wafer in the condition where the focal point of the pulsed laser beam is set inside the wafer in an area to be divided. A wafer dividing method using this laser processing method includes the steps of applying a pulsed laser beam having a transmission wavelength to the wafer from one side thereof in the condition where the focal point of the pulsed laser beam is set inside the wafer along each division line, thereby continuously forming a modified layer as a break start point inside the wafer along each division line, and next applying an external force to the wafer along each division line where the strength has been reduced by the formation of the modified layer, thereby dividing the wafer. This technique is expected to produce an effect that the width of each division line can be minimized (see Japanese Patent No. 3408805, for example).

In the above method including the steps of forming a modified layer as a break start point inside the wafer along each division line and then dividing the wafer along each division line where the modified layer is formed, the modified layer is formed inside the wafer along each division line having a small width and it is therefore desirable to apply the laser beam to the wafer from the back side thereof where the devices are not formed. Further, in the step of picking up each device (device chip) obtained by dividing the wafer along each division line, it is desirable to expose the front side of the wafer where the devices are formed. In view of these circumstances, a laser beam having a transmission wavelength to the wafer is applied to the wafer from the back side thereof along each division line to thereby form a modified layer inside the wafer along each division line. Thereafter, a dicing tape is attached to the back side of the wafer in which the modified layer is formed, and the dicing tape is supported at its peripheral portion to an annular frame. Thereafter, an external force is applied to the wafer to thereby divide the wafer into the individual devices (see Japanese Patent Laid-open No. 2006-54246, for example).

However, in the above method including the steps of forming the modified layer inside the wafer along each division line and next attaching the dicing tape to the back side of the wafer in which the modified layer is formed, there is a possibility that the wafer may be broken in attaching the dicing tape. To cope with this problem, there has been proposed a method including the steps of attaching the front side of the dicing tape to the back side of the wafer, supporting the peripheral portion of the dicing tape to the annular frame, and next applying a laser beam through the dicing tape from the back side thereof along each division line in the condition where the focal point of the laser beam is set inside the wafer, thereby forming a modified layer inside the wafer along each division line (see Japanese Patent Laid-open No. 2012-84618, for example).

SUMMARY OF THE INVENTION

However, in the case that the wafer is of such a type that the electrodes formed on each device are projecting bump electrodes, the following problem arises. That is, when the front side of the wafer whose back side is attached to the dicing tape is held on a chuck table of a laser processing apparatus and the annular frame supporting the dicing tape is fixed by frame fixing means mounted on the chuck table, the peripheral portion of the wafer is depressed by the dicing tape. Accordingly, in applying a laser beam along each division line to form a modified layer inside the wafer along each division line, the devices adjacent to the peripheral portion of the wafer may be damaged by a stress generated by the depression force of the dicing tape.

It is therefore an object of the present invention to provide a wafer processing method of processing a wafer of such a type that the electrodes formed on each device are projecting bump electrodes which method can form a desired modified layer inside the wafer along each division line without damage to each device, by applying a laser beam through the dicing tape from the back side thereof along each division line in the condition where the focal point of the laser beam is set inside the wafer.

In accordance with an aspect of the present invention, there is provided a wafer processing method of processing a wafer having a device area where a plurality of devices are formed and a peripheral marginal area surrounding the device area on the front side of the wafer, the devices being respectively formed in a plurality of separate regions defined by a plurality of division lines, each device having a plurality of bump electrodes on the front side, the wafer processing method including a wafer supporting step of attaching the front side of a dicing tape to the back side of the wafer and supporting the dicing tape at its peripheral portion to an annular frame; a wafer holding step of holding the front side of the wafer on the upper surface of a chuck table as a holding surface in the condition where the back side of the dicing tape is oriented upward and fixing the annular frame by means of clamps; an annular modified layer forming step of applying a first laser beam having a transmission wavelength to the dicing tape and the wafer through the dicing tape from the back side thereof along the boundary between the device area and the peripheral marginal area in the condition where the focal point of the first laser beam is set inside the wafer, thereby forming an annular modified layer inside the wafer along the boundary between the device area and the peripheral marginal area; and a modified layer forming step of applying a second laser beam having a transmission wavelength to the dicing tape and the wafer through the dicing tape from the back side thereof along each division line in the condition where the focal point of the second laser beam is set inside the wafer after performing the annular modified layer forming step, thereby forming a modified layer inside the wafer along each division line.

According to the wafer processing method of the present invention, the annular modified layer forming step is performed before performing the modified layer forming step, thereby forming the annular modified layer inside the wafer along the boundary between the device area and the peripheral marginal area. Accordingly, the device area is isolated from the peripheral marginal area by the annular modified layer, so that the stress generated in the peripheral marginal area by the depression force of the dicing tape can be prevented from being transmitted from the peripheral marginal area to the device area in the modified layer forming step. Accordingly, it is possible to solve the problem that the devices adjacent to the peripheral marginal area maybe broken in forming the modified layer inside the wafer along each division line in the modified layer forming step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
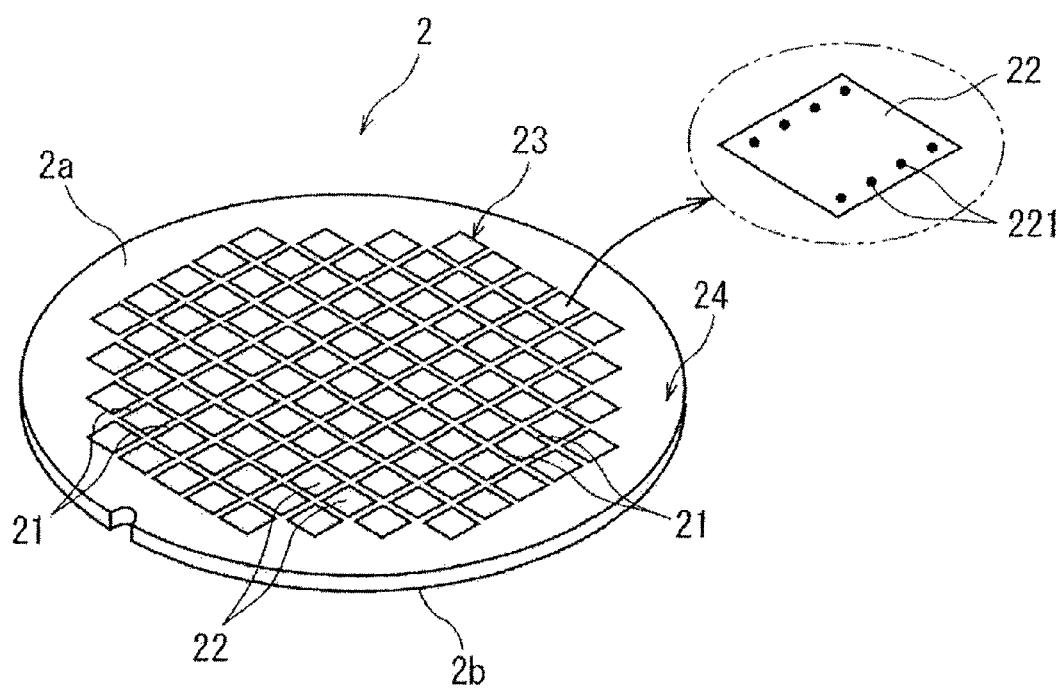
FIG. 1 is a perspective view of a semiconductor wafer.

A preferred embodiment of the wafer processing method according to the present invention will now be described in detail with reference to the attached drawings. Referring to FIG. 1, there is shown a perspective view of a semiconductor wafer 2 to be processed by the wafer processing method according to the present invention. The semiconductor wafer 2 shown in FIG. 1 is formed from a silicon wafer having a thickness of 300 μm and a diameter of 200 mm. The semiconductor wafer 2 has a front side 2a and a back side 2b. A plurality of crossing division lines 21 are formed on the front side 2a of the semiconductor wafer 2, thereby defining a plurality of rectangular separate regions where a plurality of devices 22 such as ICs and LSIs are respectively formed. The semiconductor wafer 2 includes a device area 23 where the devices 22 are formed and a peripheral marginal area 24 surrounding the device area 23. Further, a plurality of bump electrodes 221 are formed on the front side of each device 22. Each bump electrode 221 has a height of about 50 to 200 μm.

Figure 2:
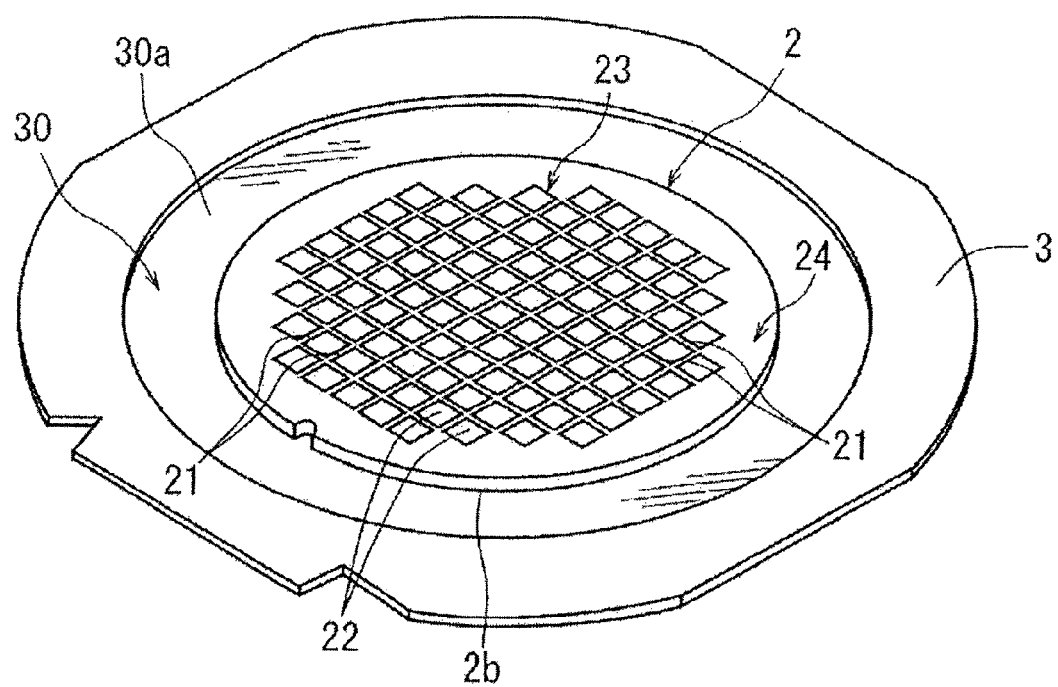
FIG. 2 is a perspective view showing a condition where the semiconductor wafer is attached to the front side of a dicing tape supported to an annular frame in a wafer supporting step.

In forming a modified layer inside the semiconductor wafer 2 along each division line 21, a wafer supporting step is first performed in such a manner that the front side of a dicing tape is attached to the back side 2b of the semiconductor wafer 2 and the dicing tape is supported at its peripheral portion to an annular frame. More specifically, as shown in FIG. 2, the peripheral portion of a dicing tape 30 is preliminarily mounted to an annular frame 3 so as to close the inside opening of the annular frame 3, and the back side 2b of the semiconductor wafer 2 is attached to the front side (adhesive side) 30a of the dicing tape 30. For example, the dicing tape 30 is formed from a polyvinyl chloride (PVC) sheet.

Figure 3:
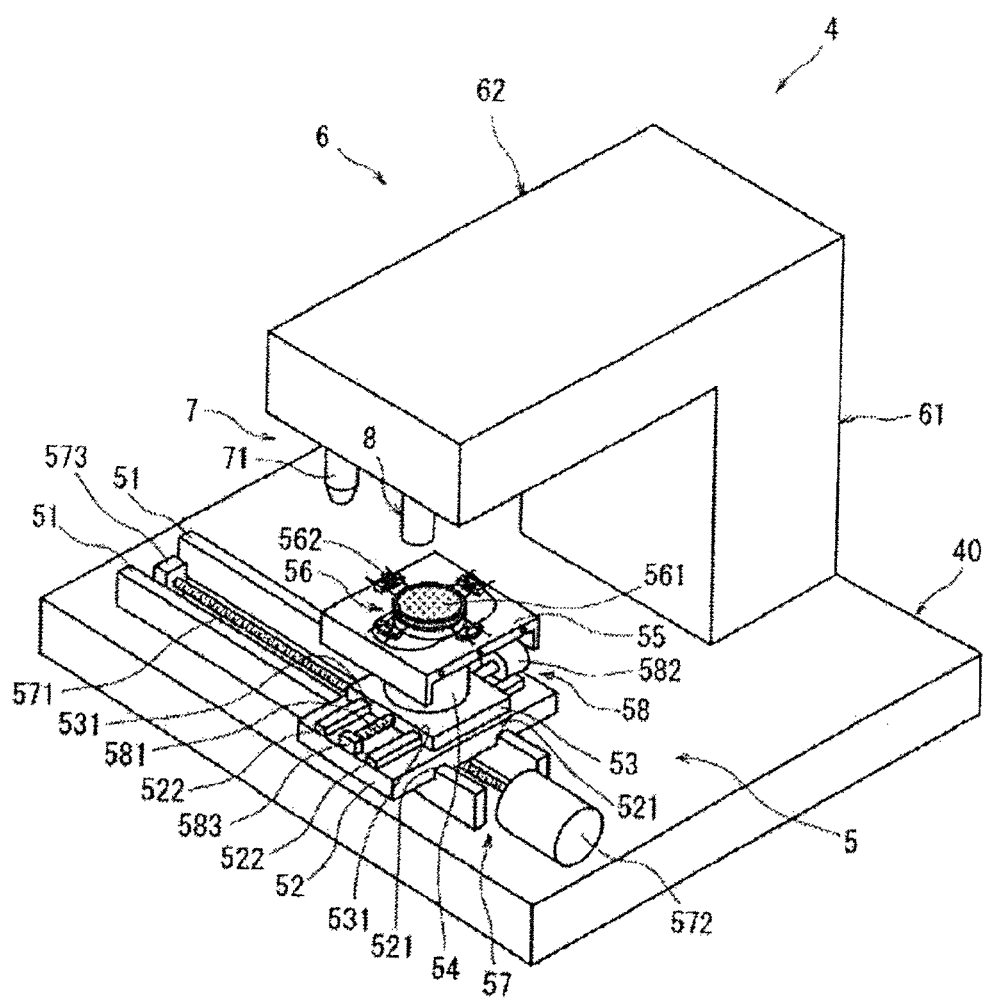
FIG. 3 is a perspective view of a laser processing apparatus.

Referring to FIG. 3, there is shown a perspective view of a laser processing apparatus 4 for performing laser processing in forming the modified layer inside the semiconductor wafer 2 along each division line 21. The laser processing apparatus 4 shown in FIG. 3 includes a stationary base 40, a chuck table mechanism 5 for holding a workpiece, the chuck table mechanism 5 being provided on the stationary base 40 so as to be movable in a feeding direction (X direction) shown by an arrow X, and a laser beam applying unit 6 provided on the stationary base 40, the laser beam applying unit 6 having laser beam applying means to be hereinafter described.

The chuck table mechanism 5 includes a pair of guide rails 51 provided on the stationary base 40 so as to extend parallel to each other in the X direction, a first slide block 52 provided on the guide rails 51 so as to be movable in the X direction, a second slide block 53 provided on the first slide block 52 so as to be movable in an indexing direction (Y direction) shown by an arrow Y perpendicular to the X direction, a cover table 55 supported by a cylindrical member 54 standing on the second slide block 53, and a chuck table 56 as wafer holding means. The chuck table 56 has a vacuum chuck 561 formed of a porous material. The semiconductor wafer 2 as a workpiece is adapted to be held under suction on the upper surface of the vacuum chuck 561 as a holding surface by operating suction means (not shown). The chuck table 56 is rotatable by a pulse motor (not shown) provided in the cylindrical member 54. The chuck table 56 is provided with clamps 562 as frame holding means for fixing the annular frame 3 supporting the semiconductor wafer 2 as a workpiece through the dicing tape 30. The clamps 562 as the frame holding means are so configured as to hold the annular frame 3 at a vertical position lower than that of the upper surface of the chuck table 56 as the holding surface.

The lower surface of the first slide block 52 is formed with a pair of guided grooves 521 for slidably engaging the pair of guide rails 51 mentioned above. A pair of guide rails 522 are provided on the upper surface of the first slide block 52 so as to extend parallel to each other in the Y direction. Accordingly, the first slide block 52 is movable in the X direction along the guide rails 51 by the slidable engagement of the guided grooves 521 with the guide rails 51. The chuck table mechanism 5 further includes feeding means 57 for moving the first slide block 52 in the X direction along the guide rails 51. The feeding means 57 includes an externally threaded rod 571 extending parallel to the guide rails 51 so as to be interposed therebetween and a pulse motor 572 as a drive source for rotationally driving the externally threaded rod 571. The externally threaded rod 571 is rotatably supported at one end thereof to a bearing block 573 fixed to the stationary base 40 and is connected at the other end to the output shaft of the pulse motor 572 so as to receive the torque thereof. The externally threaded rod 571 is engaged with a tapped through hole formed in an internally threaded block (not shown) projecting from the lower surface of the first slide block 52 at a central portion thereof. Accordingly, the first slide block 52 is moved in the X direction along the guide rails 51 by operating the pulse motor 572 to normally or reversely rotate the externally threaded rod 571.

The lower surface of the second slide block 53 is formed with a pair of guided grooves 531 for slidably engaging the pair of guide rails 522 provided on the upper surface of the first slide block 52 as mentioned above. Accordingly, the second slide block 53 is movable in the Y direction along the guide rails 522 by the slidable engagement of the guided grooves 531 with the guide rails 522. The chuck table mechanism 5 further includes indexing means 58 for moving the second slide block 53 in the Y direction along the guide rails 522. The indexing means 58 includes an externally threaded rod 581 extending parallel to the guide rails 522 so as to be interposed therebetween and a pulse motor 582 as a drive source for rotationally driving the externally threaded rod 581. The externally threaded rod 581 is rotatably supported at one end thereof to a bearing block 583 fixed to the upper surface of the first slide block 52 and is connected at the other end to the output shaft of the pulse motor 582 so as to receive the torque thereof. The externally threaded rod 581 is engaged with a tapped through hole formed in an internally threaded block (not shown) projecting from the lower surface of the second slide block 53 at a central portion thereof. Accordingly, the second slide block 53 is moved in the Y direction along the guide rails 522 by operating the pulse motor 582 to normally or reversely rotate the externally threaded rod 581.

The laser beam applying unit 6 includes a support member 61 provided on the stationary base 40, a casing 62 supported by the support member 61 so as to extend in a substantially horizontal direction, laser beam applying means 7 provided on the casing 62, and imaging means 8 provided on the casing 62 at a front end portion thereof for detecting a subject area to be laser-processed. The laser beam applying means 7 includes pulsed laser beam oscillating means (not shown) provided in the casing 62 and focusing means 71 provided at the front end portion of the casing 62 for focusing a pulsed laser beam oscillated from the pulsed laser beam oscillating means. Although not shown, the pulsed laser beam oscillating means includes a pulsed laser beam oscillator and repetition frequency setting means. The imaging means 8 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 8 is transmitted to control means (not shown).

Figure 4:
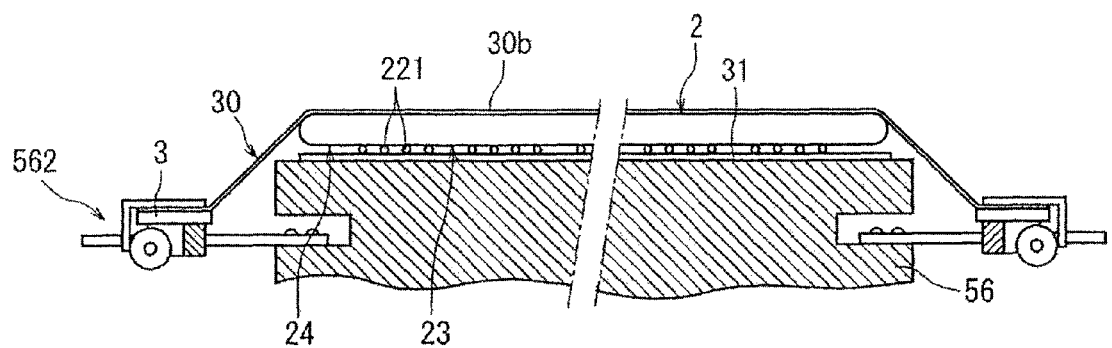
FIG. 4 is a partially sectional side view showing a wafer holding step.

In forming a modified layer inside the semiconductor wafer 2 along each division line 21 by using the laser processing apparatus 4 after performing the wafer supporting step mentioned above, a wafer holding step is first performed in such a manner that the front side 2a of the semiconductor wafer 2 is held on the upper surface of the chuck table 56 as the holding surface and the annular frame 3 is held by the clamps 562 as the frame holding means. More specifically, as shown in FIG. 4, the semiconductor wafer 2 supported through the dicing tape 30 to the annular frame 3 is placed on the upper surface of the chuck table 56 as the holding surface in the condition where the front side 2a of the semiconductor wafer 2 is oriented downward. At this time, a porous sheet 31 is preferably interposed between the front side 2a of the semiconductor wafer 2 and the upper surface of the chuck table 56, so as to protect the devices 22 including the bump electrodes 221. Thereafter, the suction means (not shown) is operated to hold the semiconductor wafer 2 through the porous sheet 31 on the upper surface of the chuck table 56 under suction. Thereafter, the annular frame 3 is fixed by the clamps 562. Accordingly, the semiconductor wafer 2 is held on the chuck table 56 in the condition where the back side (nonadhesive side) 30b of the dicing tape 30 attached to the semiconductor wafer 2 is oriented upward. When the annular frame 3 supporting the peripheral portion of the dicing tape 30 is fixed by the clamps 562, the peripheral marginal area 24 of the semiconductor wafer 2 is depressed by the dicing tape 30 with the bump electrodes 221 functioning as a fulcrum because the bump electrodes 221 are higher in position than the clamps 562, causing the generation of stress in the peripheral marginal area 24.

After performing the wafer holding step mentioned above, the feeding means 57 is operated to move the chuck table 56 holding the semiconductor wafer 2 under suction to a position directly below the imaging means 8. When the chuck table 56 is positioned directly below the imaging means 8, a first alignment step is performed by the imaging means 8 and the control means (not shown) to detect the boundary between the device area 23 and the peripheral marginal area 24 of the semiconductor wafer 2. More specifically, the imaging means 8 and the control means (not shown) detect the position radially inside from the outer circumference of the semiconductor wafer 2 by an amount of 5 mm, for example, and then store the coordinate values of this position into a memory constituting the control means. Although the dicing tape 30 is present on the upper side of the semiconductor wafer 2, the outer circumference of the semiconductor wafer 2 can be imaged from the back side 30b of the dicing tape 30 because the imaging means 8 includes the infrared light applying means for applying infrared light, the optical system for capturing the infrared light, and the imaging device (infrared CCD) for outputting an electrical signal corresponding to the infrared light.

Figure 5:
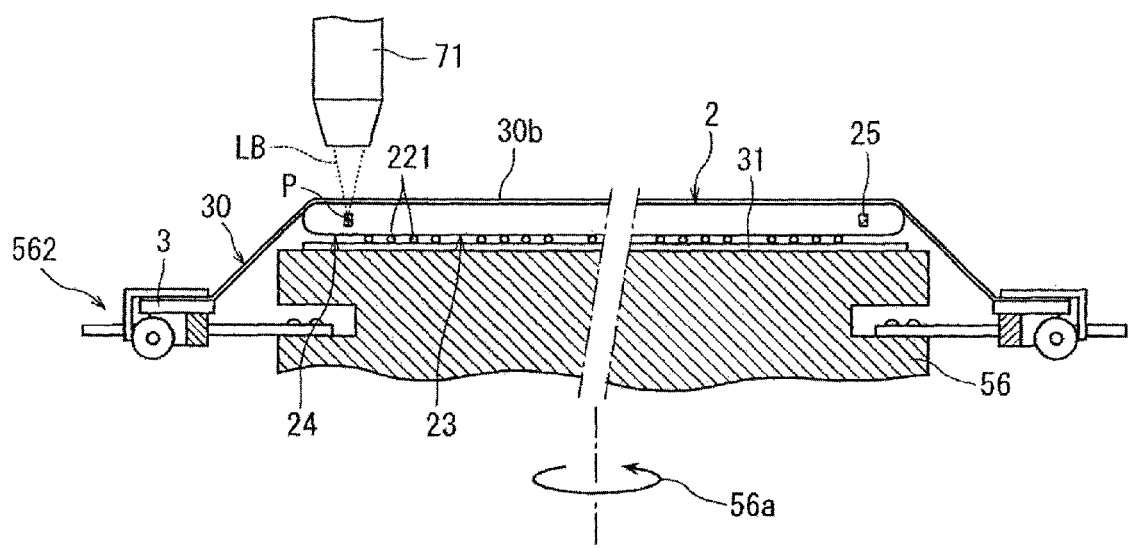
FIG. 5 is a partially sectional side view showing an annular modified layer forming step.

After performing the first alignment step mentioned above, an annular modified layer forming step is performed in such a manner that a laser beam having a transmission wavelength to the dicing tape 30 and the semiconductor wafer 2 is applied through the dicing tape 30 from the back side 30b thereof along the boundary between the device area 23 and the peripheral marginal area 24 in the condition where the focal point of the laser beam is set inside the semiconductor wafer 2, thereby forming an annular modified layer inside the semiconductor wafer 2 along the boundary between the device area 23 and the peripheral marginal area 24. More specifically, in performing this annular modified layer forming step, the feeding means 57 is operated to move the chuck table 56 holding the semiconductor wafer 2 from the condition where the first alignment step has been performed to a laser beam applying area where the focusing means 71 is located. That is, the position radially inside from the outer circumference of the semiconductor wafer 2 by an amount of 5 mm, for example, is set directly below the focusing means 71 as shown in FIG. 5. Thereafter, the focal point P of the pulsed laser beam LB to be applied from the focusing means 71 is set near the intermediate position in the direction of the thickness of the semiconductor wafer 2. Thereafter, the pulsed laser beam LB having a transmission wavelength to the dicing tape 30 and the semiconductor wafer 2 (silicon wafer) is applied from the focusing means 71. At the same time, the chuck table 56 holding the semiconductor wafer 2 under suction is rotated 360 degrees in the direction shown by an arrow 56a in FIG. 5. As a result, an annular modified layer 25 is formed inside the semiconductor wafer 2 along the boundary between the device area 23 and the peripheral marginal area 24 as shown in FIG. 5.

For example, the annular modified layer forming step mentioned above may be performed under the following processing conditions.

Light source: YAG pulsed laser
Wavelength: 1064 nm
Repetition frequency: 50 kHz
Average power: 0.5 W After performing the annular modified layer forming step mentioned above, a modified layer forming step is performed in such a manner that a laser beam having a transmission wavelength to the dicing tape 30 and the semiconductor wafer 2 is applied through the dicing tape 30 from the back side 30b thereof along each division line 21 in the condition where the focal point of the laser beam is set inside the semiconductor wafer 2, thereby forming a modified layer inside the semiconductor wafer 2 along each division line 21. More specifically, in performing this modified layer forming step, the feeding means 57 is operated to move the chuck table 56 holding the semiconductor wafer 2 under suction to the position directly below the imaging means 8. In this condition, a second alignment step is performed to detect a subject area of the semiconductor wafer 2 to be laser-processed. More specifically, the imaging means 8 and the control means (not shown) are operated to make the alignment between the division lines 21 extending in a first direction on the semiconductor wafer 2 and the focusing means 71 for applying the laser beam along the division lines 21. Similarly, this alignment is made between the focusing means 71 and the remaining division lines 21 extending in a second direction perpendicular to the first direction on the semiconductor wafer 2. Although the front side 2a on which the division lines 21 of the semiconductor wafer 2 are formed is oriented downward, the division lines 21 can be imaged from the back side 30b of the dicing tape 30 and the back side 2b of the semiconductor wafer 2 because the imaging means 8 includes the infrared light applying means for applying infrared light, the optical system for capturing the infrared light, and the imaging device (infrared CCD) for outputting an electrical signal corresponding to the infrared light.

Figure 6A:
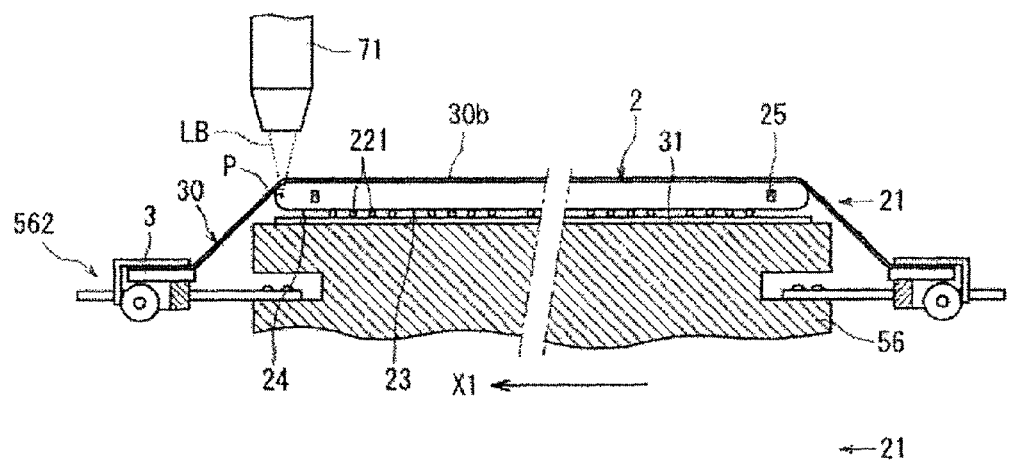
FIGS. 6A and 6B are partially sectional side views showing a modified layer forming step.

After performing the second alignment step mentioned above, the chuck table 56 is moved to the laser beam applying area where the focusing means 71 of the laser beam applying means 7 is located, and a predetermined one of the division lines 21 extending in the first direction on the semiconductor wafer 2 held on the chuck table 56 is positioned directly below the focusing means 71 as shown in FIG. 6A. At this time, one end (left end as viewed in FIG. 6A) of the predetermined division line 21 is positioned directly below the focusing means 71 as shown in FIG. 6A. Thereafter, the focal point P of the pulsed laser beam LB to be applied from the focusing means 71 is set near the intermediate position in the direction of the thickness of the semiconductor wafer 2. Thereafter, the pulsed laser beam LB having a transmission wavelength to the dicing tape 30 and the semiconductor wafer 2 (silicon wafer) is applied from the focusing means 71. At the same time, the chuck table 56 is moved in the direction shown by an arrow X1 in FIG. 6A at a predetermined feed speed (modified layer forming step).

Figure 6B:
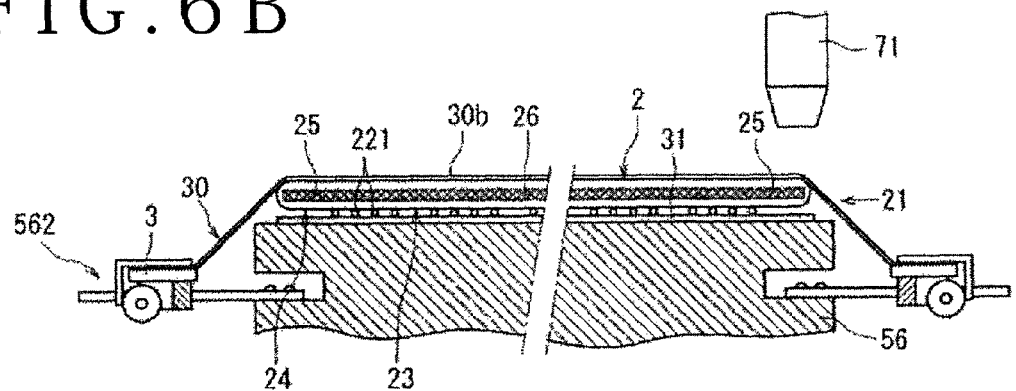

When the other end (right end as viewed in FIG. 6B) of the predetermined division line 21 reaches the position directly below the focusing means 71 as shown in FIG. 6B, the application of the pulsed laser beam LB is stopped and the movement of the chuck table 56 is also stopped. As a result, a modified layer 26 is formed inside the semiconductor wafer 2 along the predetermined division line 21 as shown in FIG. 6B.

For example, the modified layer forming step mentioned above may be performed under the following processing conditions.

Light source: YAG pulsed laser
Wavelength: 1064 nm
Repetition frequency: 50 kHz
Average power: 0.5 W
Work feed speed: 100 mm/s After performing the modified layer forming step along the predetermined division line 21 as mentioned above, the chuck table 56 is moved in the Y direction by an amount corresponding to the pitch of the division lines 21 (indexing step), and the modified layer forming step is performed similarly along the next division line 21 extending in the first direction. After performing the modified layer forming step along all of the division lines 21 extending in the first direction, the chuck table 56 is rotated 90 degrees to similarly perform the modified layer forming step along all of the remaining division lines 21 extending in the second direction perpendicular to the first direction.

As described above, the annular modified layer forming step is performed before performing the modified layer forming step, thereby forming the annular modified layer 25 inside the semiconductor wafer 2 along the boundary between the device area 23 and the peripheral marginal area 24. Accordingly, the device area 23 is isolated from the peripheral marginal area 24 by the annular modified layer 25, so that the stress generated in the peripheral marginal area 24 by the depression force of the dicing tape 30 can be prevented from being transmitted from the peripheral marginal area 24 to the device area 23 in the modified layer forming step. Accordingly, it is possible to solve the problem that the devices adjacent to the peripheral marginal area 24 may be broken in forming the modified layer 26 inside the semiconductor wafer 2 along each division line 21 in the modified layer forming step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a wafer having a device area where a plurality of devices are formed and a peripheral marginal area surrounding said device area on a front side of said wafer, said devices being respectively formed in a plurality of separate regions defined by a plurality of division lines, each device having a plurality of bump electrodes on the front side, said wafer processing method comprising:

a wafer supporting step of attaching a front side of a dicing tape to the back side of said wafer and supporting said dicing tape at its peripheral portion to an annular frame;

a wafer holding step of holding the front side of said wafer on an upper surface of a chuck table as a holding surface in a condition where a back side of said dicing tape is oriented upward and fixing said annular frame by means of clamps;

an annular modified layer forming step of applying a first laser beam having a transmission wavelength to said dicing tape and said wafer through said dicing tape from the back side thereof along a boundary between said device area and said peripheral marginal area in a condition where the focal point of said first laser beam is set inside said wafer, thereby forming an annular modified layer inside said wafer along the boundary between said device area and said peripheral marginal area; and a modified layer forming step of applying a second laser beam having a transmission wavelength to said dicing tape and said wafer through said dicing tape from the back side thereof along each division line in a condition where the focal point of said second laser beam is set inside said wafer after performing said annular modified layer forming step, thereby forming a modified layer inside said wafer along each division line.

* * * * *